US008698147B2

(12) United States Patent
Choi et al.

(10) Patent No.: US 8,698,147 B2
(45) Date of Patent: Apr. 15, 2014

(54) ORGANIC LIGHT EMITTING DISPLAY DEVICE COMPRISING A METAL DIFFUSION MEDIUM LAYER AND METHOD OF MANUFACTURING THE SAME

(75) Inventors: Jong-Hyun Choi, Yongin (KR); Na-Young Kim, Yongin (KR); Dae-Woo Lee, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 126 days.

(21) Appl. No.: 13/244,048

(22) Filed: Sep. 23, 2011

(65) Prior Publication Data

US 2012/0104397 A1    May 3, 2012

(30) Foreign Application Priority Data

Oct. 28, 2010   (KR) .................. 10-2010-0106021

(51) Int. Cl.
*H01L 29/04*    (2006.01)
*H01L 29/10*    (2006.01)
*H01L 31/00*    (2006.01)

(52) U.S. Cl.
USPC ........ 257/59; 257/40; 257/E29.117; 257/301; 257/302; 257/303; 257/304; 257/305; 257/306; 257/307

(58) Field of Classification Search
CPC ............... H01L 27/1214; G02F 1/136227
USPC ................. 257/40, 59, E29.117, 301–307
See application file for complete search history.

(56) References Cited

U.S. PATENT DOCUMENTS

| | | | |
|---|---|---|---|
| 7,598,102 B1 * | 10/2009 | Yu et al. ..................... | 438/29 |
| 8,189,157 B2 | 5/2012 | Watanabe et al. | |
| 2003/0025158 A1 * | 2/2003 | Makita et al. ............... | 257/347 |
| 2006/0091399 A1 * | 5/2006 | Lee ............................. | 257/72 |
| 2007/0153141 A1 * | 7/2007 | Tsai et al. ................... | 349/38 |
| 2010/0193790 A1 * | 8/2010 | Yeo et al. .................... | 257/59 |
| 2010/0201658 A1 * | 8/2010 | Koshiishi et al. .......... | 345/205 |

FOREIGN PATENT DOCUMENTS

| | | |
|---|---|---|
| KR | 10-2004-0056953 | 7/2004 |
| KR | 10-2005-0004670 | 1/2005 |
| KR | 10-2007-0049744 | 5/2007 |

* cited by examiner

*Primary Examiner* — Anthony Ho
*Assistant Examiner* — David Chen
(74) *Attorney, Agent, or Firm* — Robert E. Bushnell, Esq.

(57) ABSTRACT

Provided are an organic light emitting display device and a method of manufacturing the same. The organic light emitting display device includes a thin-film transistor (TFT), which includes an active layer, a gate electrode, and source/drain electrodes; an organic electroluminescent device electrically connected to the TFT and includes a pixel electrode formed on the same layer as the gate electrode, an intermediate layer including an organic light emitting layer, and a counter electrode that are stacked in the order stated; and a capacitor, which includes a bottom electrode, which is formed on the same layer and of the same material as the active layer and is doped with an impurity; a top electrode formed on the same layer as the gate electrode; and a metal diffusion medium layer formed on the same layer as the source/drain electrodes and is connected to the bottom electrode.

17 Claims, 9 Drawing Sheets

ORGANIC LIGHT EMITTING DISPLAY DEVICE COMPRISING A METAL DIFFUSION MEDIUM LAYER AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on 28 Oct. 2010 and there duly assigned Serial No. 10-2010-0106021.

BACKGROUND OF THE INVENTION

1. Field of the Invention

The present invention relates to an organic light emitting display device and a method of manufacturing the same, and more particularly, to an organic light emitting display device, which may be manufactured with a relatively small number of masking operations and may resolve coarse doping in a capacitor, and a method of manufacturing the same.

2. Description of the Related Art

An organic light emitting display device is fabricated on a substrate, in which a thin-film transistor (TFT), a capacitor, and a wiring for connecting them to each other are formed.

Generally, to form a fine structure pattern having a TFT, such a fine pattern is transferred to a substrate for fabricating an organic light emitting display device by using a mask including the fine pattern.

Generally, a photolithography operation is performed to transfer a pattern by using a mask. In a photolithography operation, photoresist is uniformly applied onto a substrate, the photoresist is exposed to light by using an exposer, e.g., a stepper, and in case of positive photoresist, the exposed photoresist is developed. Furthermore, after the photoresist is developed, a pattern is etched by using residue photoresist as a mask, and unnecessary photoresist is removed.

In such an operation for transferring a pattern by using a mask, a mask having a necessary pattern shall be prepared. Therefore, as a number of operations using masks increases, the overall fabrication costs increases due to the cost for preparation of the masks. Therefore, it is necessary to reduce a number of times of using masks as much as possible.

Meanwhile, to reduce a number of times of using masks, it may be considered to form one of electrodes of a capacitor together with an active layer using a poly silicon crystal and implanting an impurity thereto later. In this case, if a plurality of regions is formed at once as a single layer to reduce a number of times of using masks, a capacitor electrode may be covered by a thin-film layer formed prior to impurity implantation, and thus the capacitor electrode may not be uniformly doped. If a capacitor electrode is not uniformly doped, electric resistance increases, and thus a desired capacitance may not be secured. Therefore, it is necessary to reduce a number of times of using masks and avoid increase of resistance due to coarse impurity implantation.

SUMMARY OF THE INVENTION

The present invention provides an improved organic light emitting display device, which may be manufactured with a relatively small number of masking operations and may resolve coarse doping in a capacitor, and a method of manufacturing the same.

According to an aspect of the present invention, there is provided an organic light emitting display device including a thin-film transistor (TFT), which includes an active layer, a gate electrode, a source electrode and a drain electrode; an organic electroluminescent device, which is electrically connected to the TFT and includes a pixel electrode, which is formed on the same layer as the gate electrode, an intermediate layer including an organic light emitting layer, and a counter electrode that are stacked in the order stated; and a capacitor, which includes a bottom electrode, which is formed on the same layer and of the same material as the active layer and is doped with an impurity; a top electrode, which is formed on the same layer as the gate electrode; and a metal diffusion medium layer, which is formed on the same layer as the source/drain electrodes and is connected to the bottom electrode.

The gate electrode may include a first electrode, which is formed on the same layer and of the same material as the pixel electrode; and a second electrode, which is formed on the first electrode.

The top electrode may include a first top electrode, which is formed on the same layer and of the same material as the first electrode; and a second top electrode, which is formed on the same layer on the first electrode and of the same material as the second electrode and is partially removed to expose the first top electrode.

The pixel electrode may be electrically connected to one of the source and drain electrodes.

A plurality of slits may be formed in the bottom electrodes, and the metal diffusion medium layer may be connected to the bottom electrode between the plurality of slits.

A groove may be formed in the bottom electrode, the metal diffusion medium layer may be connected to the bottom electrode via the groove, and the groove may be formed to a buffer layer.

According to another aspect of the present invention, there is provided a method of manufacturing an organic light emitting display device, the method including forming an active layer of a thin-film transistor (TFT) and a bottom electrode of a capacitor on a substrate in a first masking operation; forming electrode patterns for forming a gate electrode on the active layer, a pixel electrode, and a top electrode of the capacitor on the bottom electrode in a second masking operation; forming an interlayer insulation layer, which includes openings for exposing the two opposite ends of the active layer, a portion of the pixel electrode, a portion of the top electrode, and a portion of the bottom electrode in a third masking operation; forming a source and a drain electrodes, which contact the two opposite ends of the active layer and the portion of the pixel electrode exposed by the openings, a metal diffusion medium layer, which contacts the portion of the bottom electrode exposed by the opening, and forming the pixel electrode and the top electrode in a fourth masking operation; and forming a pixel defining layer, which exposes the pixel electrode in a fifth masking operation.

The second masking operation may include depositing a first insulation layer, a first conductive layer, and a second conductive layer on the active layer and the bottom electrode in the order stated; and forming the gate electrode, which utilizes the first conductive layer as a first electrode and utilizes the second conductive layer as a second electrode, by patterning the first conductive layer and the second conductive layer. The method may further include forming a source region, a drain region and a channel region therebetween by doping the active layer.

The third masking operation may include depositing a second insulation layer on the gate electrode and the electrode pattern; and forming openings for exposing the two opposite ends of the active layer, a portion of the pixel electrode, a portion of the top electrode, and a portion of the bottom electrode by patterning the second insulation layer.

The fourth masking operation may include depositing a third conductive layer on the interlayer insulation layer; and forming the source/drain electrodes and the metal diffusion medium layer by patterning the third conductive layer.

The fourth masking operation may further include forming the pixel electrode and the top electrode utilizing the first conductive layer as electrodes by removing the second conductive layer constituting the electrode pattern.

The capacitor top electrode may include a first top electrode, which is formed of the first conductive layer; and a second top electrode, which is a remain of the second conductive layer. The fourth masking operation may further include doping the bottom electrode with an impurity via the top electrode and diffusing metal atoms in the metal diffusion medium layer into the bottom electrode.

The fifth masking operation may include stacking a third insulation layer on the substrate; and forming a pixel defining layer by patterning the third insulation layer.

A plurality of slits may be formed in the bottom electrode during the first masking operation, and the openings for partially exposing the bottom electrode may be formed between the plurality of slits during the third masking operation.

The first masking operation may further include forming a groove via which the metal diffusion medium layer is connected to the bottom electrode.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
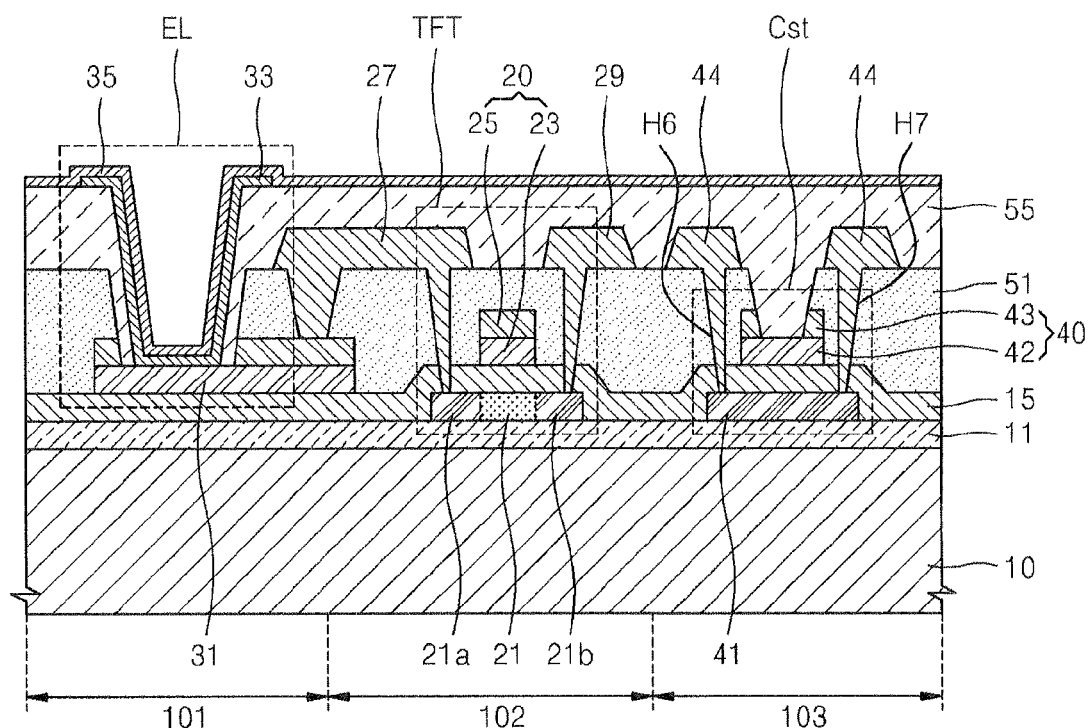
FIG. 1 is a sectional view roughly showing a portion of a bottom emission type organic light emitting display device according to an embodiment of the present invention.

The present invention will now be described more fully with reference to the accompanying drawings, in which exemplary embodiments of the invention are shown.

Like reference numerals in the drawings denote like elements. In the description of the present invention, if it is determined that a detailed description of commonly-used technologies or structures related to the invention may unnecessarily obscure the subject matter of the invention, the detailed description will be omitted. In the drawings, the thicknesses of layers and regions are exaggerated for clarity. It will also be understood that when a layer is referred to as being "on" another layer or substrate, it can be directly on the other layer or substrate, or intervening layers may also be present.

FIG. 1 is a sectional view roughly showing a portion of a bottom emission type organic light emitting display device according to an embodiment of the present invention.

Referring to FIG. 1, an organic light emitting display device according to the present invention defines a light emitting region 101, a switching region 102, and a storage region 103.

In the switching region 102, a thin-film transistor (TFT) is arranged as a driving device. The TFT includes an active layer 21, a gate electrode 20, and source/drain electrodes 27 and 29. The gate electrode 20 includes a gate bottom electrode 23 (referred to hereinafter as a first electrode) and a gate top electrode 25 (referred to hereinafter as a second electrode), where the first electrode 23 is formed of a transparent conductive material. A gate insulation layer 15 (referred to hereinafter as a first insulation layer) is interposed between the gate electrode 20 and the active layer 21 for insulation therebetween. Furthermore, source/drain regions 21a and 21b, which are densely doped with impurities, are formed at two opposite ends of the active layer 21 and are respectively connected to the source/drain electrodes 27 and 29.

An organic electroluminescent device EL is arranged in the light emitting region 101. The organic electroluminescent device EL includes a pixel electrode 31, which is connected to either of the source/drain electrodes 27 and 29 of the TFT, a counter electrode 35, and an intermediate layer 33 interposed therebetween. The pixel electrode 31 is formed of a transparent conductive material and is simultaneously formed with the gate electrode 20 of the TFT.

The storage region 103 includes a capacitor Cst. The capacitor Cst includes a bottom electrode 41 and top electrodes 42 and 43, where the first insulation layer 15 is interposed therebetween. The top electrodes 42 and 43 of the capacitor Cst are simultaneously formed with the gate electrode 20 of the TFT and the pixel electrode 31 of the organic electroluminescent device EL.

FIGS. 2 through 11 are sectional views roughly showing a process of manufacturing the organic light emitting display device shown in FIG. 1.

Figure 2:
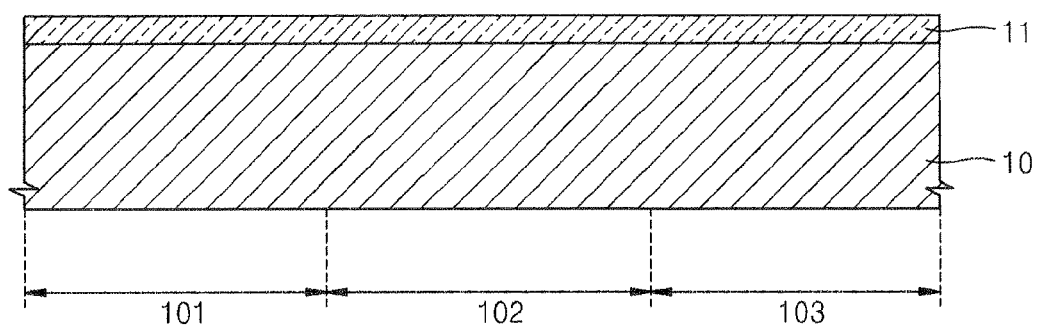
FIGS. 2 through 11 are sectional views roughly showing a process of manufacturing the organic light emitting display device shown in FIG. 1.

Referring to FIG. 2, a buffer layer 11 is formed on a substrate 10 to secure planarity of the substrate 10 and to block permeation of impurities to the substrate 10.

The substrate 10 may be formed of a $SiO_2$-based transparent glass material. However, the substrate 10 is not limited thereto. The substrate 10 may be formed of any of various materials, such as a transparent plastic material or a metal.

Figure 3:
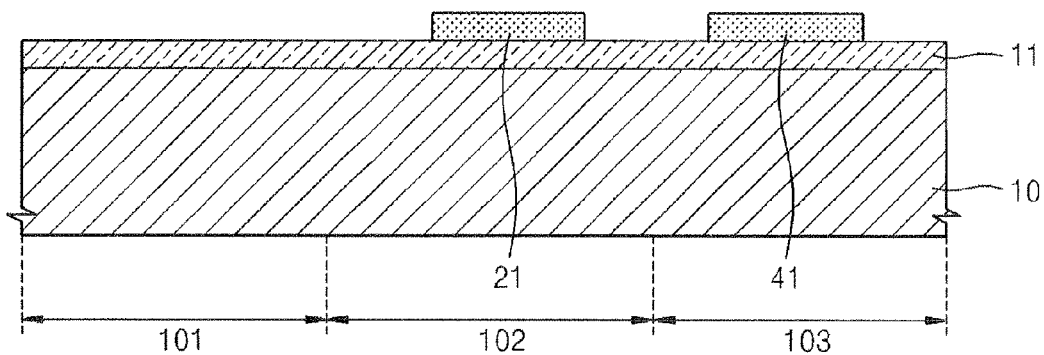

Referring to FIG. 3, the active layer 21 of the TFT and the bottom electrode 41 of the capacitor Cst are formed on the buffer layer 11. In other words, the active layer 21 of the TFT and the bottom electrode 41 of the capacitor Cst are patterned in a masking operation using a first mask (not shown). The active layer 21 and the bottom electrode 41 may be formed of a poly-crystal silicon material.

Figure 4:
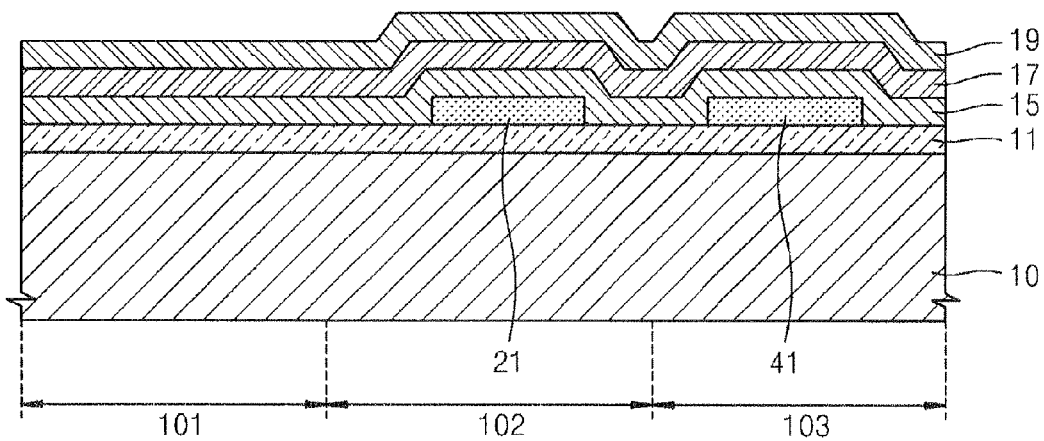

Referring to FIG. 4, the first insulation layer 15, a first conductive layer 17, and a second conductive layer 19 are formed on the entire surface of the substrate 10, on which the active layer 21 and the capacitor bottom electrode 41 are formed, in the order stated.

The first insulation layer 15 may be formed by depositing an inorganic insulation layer, such as a $SiN_x$ layer or a $SiO_x$ layer, by using PECVD method, APCVD method, or LPCVD method. The first insulation layer 15 is interposed between the active layer 21 and the gate electrode 20 of the TFT and functions as a gate insulation layer of the TFT. Furthermore, the first insulation layer 15 is interposed between the capacitor top electrodes 42 and 43 and the capacitor bottom electrode 41 and functions as a dielectric layer of the capacitor Cst.

The first conductive layer 17 may contain one or more materials selected from among transparent materials including ITO, IZO, ZnO, and $In_2O_3$. Later in the process, the first conductive layer 17 is patterned to the pixel electrode 31, a gate first electrode 23, and a capacitor first top electrode 42.

The second conductive layer 19 may contain one or more materials selected from among Ag, Mg, Al, Pt, Pd, Au, Ni, Nd, Ir, Cr, Li, Ca, Mo, Ti, W, MoW, and Al/Cu. Later in the process, the second conductive layer 19 is patterned to a gate second electrode 25 and a capacitor second top electrode 43.

Figure 5:
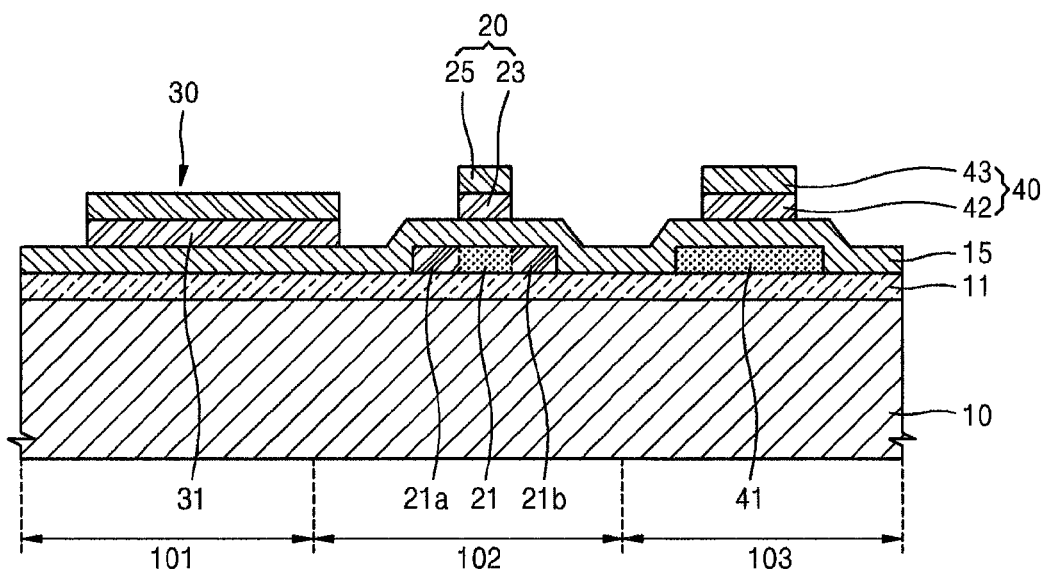

Referring to FIG. 5, the gate electrode 20 and electrode patterns 30 and 40 are formed on the substrate 10.

The first conductive layer 17 and the second conductive layer 19, which are sequentially stacked on the entire surface of the substrate 10, are patterned in a masking operation using a second mask (not shown).

The gate electrode 20 is formed on the active layer 21 in the switching region 102, where the gate electrode 20 includes the first electrode 23, which is formed of a portion of the first conductive layer 17, and the second electrode 25, which is formed of a portion of the second conductive layer 19.

The electrode pattern 30 for forming the pixel electrode 31 later is formed in the light emitting region 101, whereas the electrode pattern 40 for forming the capacitor first top electrode 42 and the capacitor second top electrode 43 is formed on the capacitor bottom electrode 41 in the storage region 103.

The gate electrode 20 corresponds to the center of the active layer 21, and the source/drain regions 21a and 21b are formed on the two opposite ends of the active layer 21, which correspond to the two opposite ends of the gate electrode 20, and a channel region are formed therebetween by implanting an n-type or a p-type impurity to the active layer 21 by using the gate electrode 20 as a mask.

Figure 6:
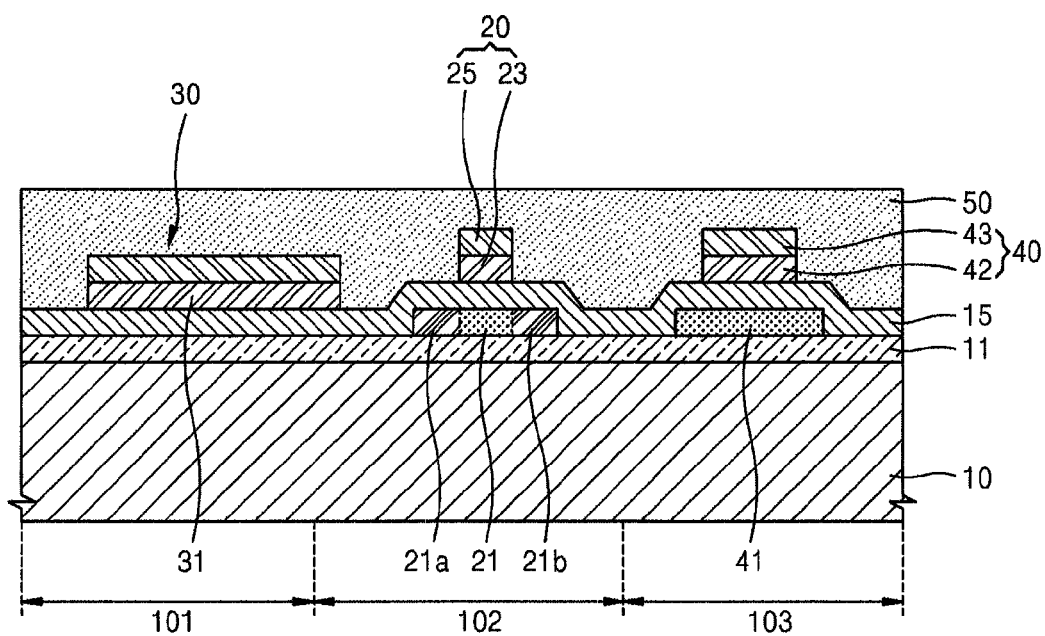

Referring to FIG. 6, a second insulation layer 50 is formed on the entire surface of the substrate 10, on which the gate electrode 20 is formed.

The second insulation layer 50 is formed of one or more organic insulation material selected from a group consisting of polyimide, polyamide, acrylic resin, benzocyclobuten, and phenol resin by using a method, such as spin coating. The second insulation layer 50 is formed to have a sufficient thickness, e.g., a thickness greater than that of the first insulation layer 15, to function as an interlayer insulation layer between the gate electrode 20 and the source/drain regions 27 and 29. Meanwhile, the second insulation layer 50 may be formed of not only insulation organic materials as stated above, but also inorganic insulation materials as the first insulation layer 15. Furthermore, the second insulation layer 50 may also be formed by alternately stacking an organic insulation material and an inorganic insulation material.

Figure 7:
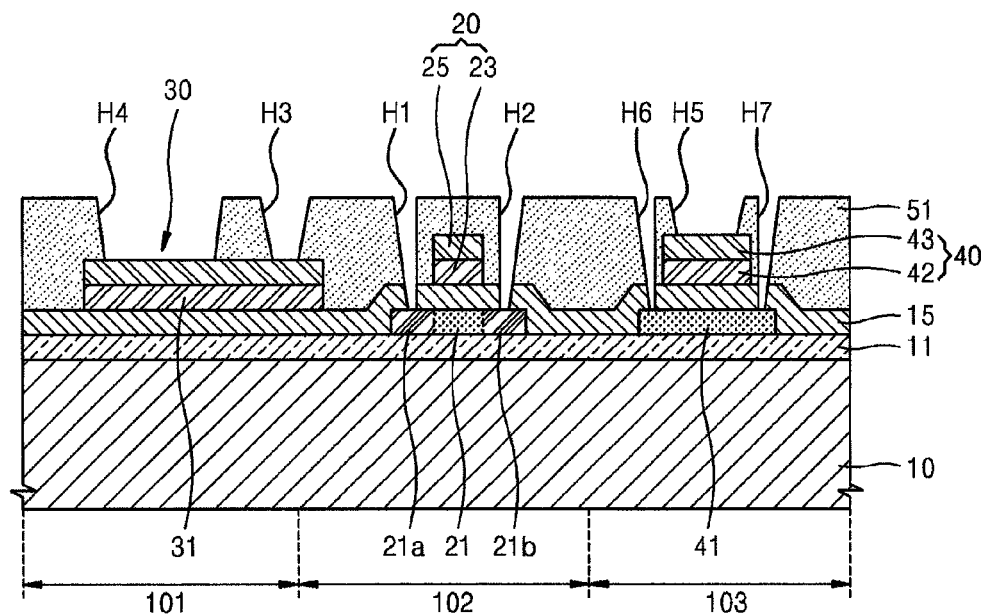

Referring to FIG. 7, an interlayer insulation layer 51 having openings H1 through H7, which expose portions of the electrode patterns 30 and 40 and the source/drain regions 21a and 21b, is formed.

The openings H1 through H7 are formed by patterning the second insulation layer 50 in a masking operation using a third mask (not shown).

The openings H1 and H2 expose portions of the source/drain regions 21a and 21b, the openings H3 and H4 expose portions of the second conductive layer 19, which constitute the upper portion of the electrode pattern 30 in the light emitting region 101, and the opening H5 exposes a portion of the second conductive layer 19, which constitutes the upper portion of the electrode pattern 40 in the storage region 103. Furthermore, the openings H6 and H7 expose portions of the capacitor bottom electrode 41.

Figure 8:
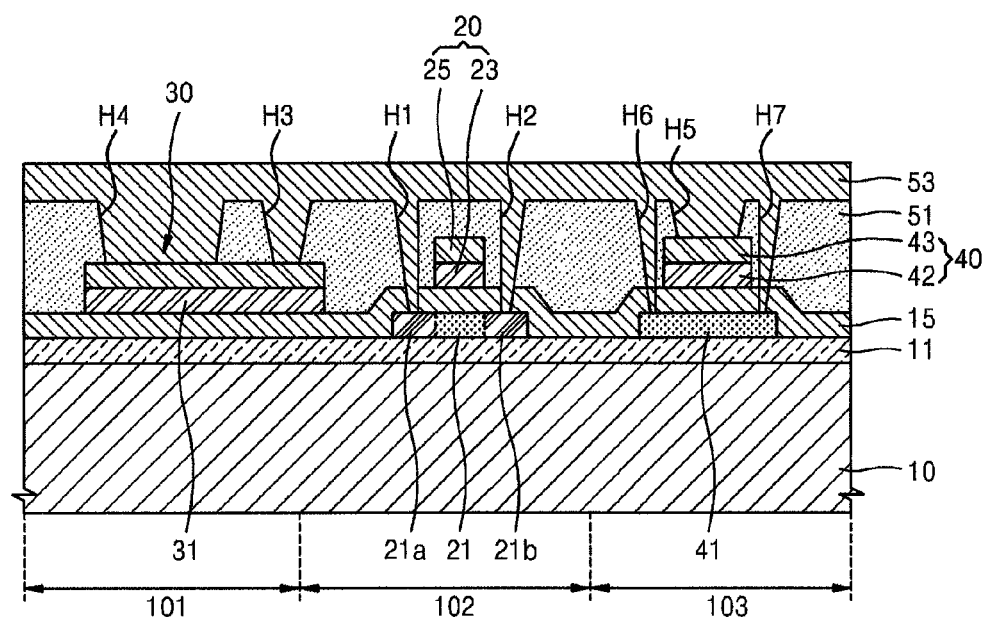

Referring to FIG. 8, a third conductive layer 53 covering the interlayer insulation layer 51 is formed on the whole surface of the substrate 10.

The third conductive layer 53 may be formed of the same material as the first conductive layer 17 or the second conductive layer 19. However, the third conductive layer 53 is not limited thereto, and the third conductive layer 53 may be formed of any of various conductive materials. Furthermore, the conductive material is deposited to a thickness sufficient to fill the openings H1 through H7.

Figure 9:
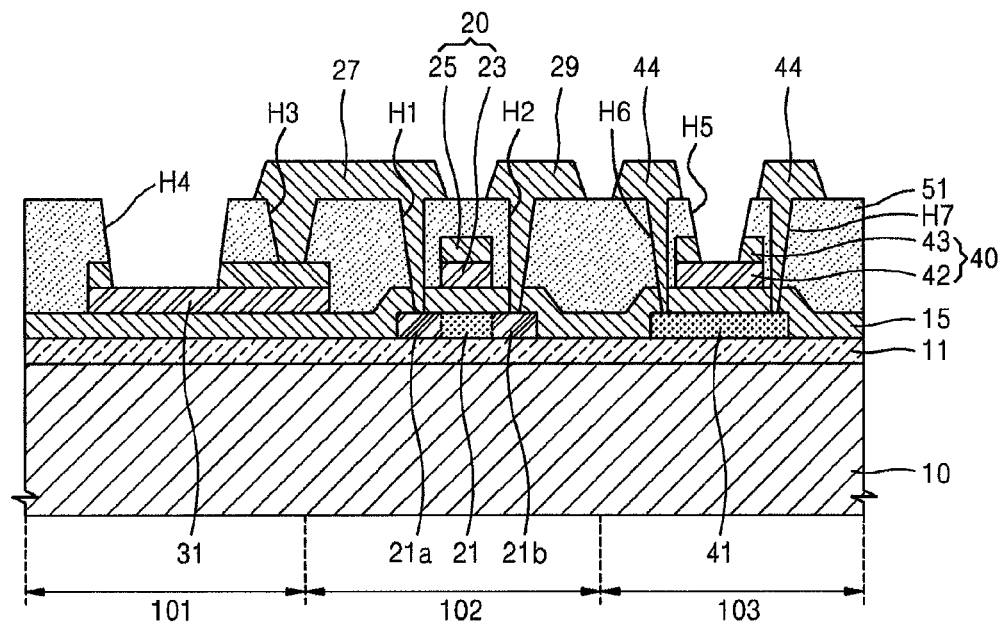

Referring to FIG. 9, the source/drain regions 27 and 29 and a metal diffusion medium layer 44 are formed by patterning the third conductive layer 53. Furthermore, the pixel electrode 31 and the capacitor top electrodes 42 and 43 are formed by etching process. In other words, the source/drain regions 27 and 29 and the metal diffusion medium layer 44 are formed by patterning the third conductive layer 53 in a masking operation using a fourth mask (not shown).

One of the source/drain regions 27 and 29 (in case of the present embodiment, the source electrode 27) is formed to be connected to the pixel electrode 31 via the opening H3 in the edge region of the second conductive layer 19 on the electrode pattern 30 on which the pixel electrode 31 is to be formed.

The metal diffusion medium layer 44 is connected to the capacitor bottom electrode 41 of the capacitor Cst. In this case, metal atoms of the metal diffusion medium layer 44 diffuse into the capacitor bottom electrode 41 via a simple heat treatment and lowers the resistance in the capacitor bottom electrode 41. For example, if the metal diffusion medium layer 44 is formed of titanium and aluminum, aluminum atoms diffuse into the capacitor bottom electrode 41. The structure is effective for reducing increase of resistance due to coarsely doped impurity as described below.

Next, after the source/drain regions 27 and 29 are formed, the pixel electrode 31 and the capacitor top electrodes 42 and 43 are formed by further etching process.

The pixel electrode 31 is formed by removing a portion of the second conductive layer 19 exposed by the opening H4 in the electrode pattern 30 in the light emitting region 101.

The capacitor top electrodes 42 and 43 are formed by removing a portion of the second conductive layer 19 exposed by the opening H5 in the electrode pattern 40 in the storage region 103. At this point, the capacitor first top electrode 42, which is formed of the first conductive layer 17, remains, whereas the capacitor second top electrode 43, which is formed of the second conductive layer 19, is partially removed, such that the capacitor first top electrode 42 is exposed. In fact, although it is preferable to completely remove the capacitor second top electrode 43, a portion of the capacitor second top electrode 43 in the interlayer insulation layer 51 is not removed and remains. In other words, a portion of the capacitor second top electrode 43 is not remained for purpose. However, the remaining portion of the capacitor second top electrode 43 may cover a portion of the capacitor bottom electrode 41 while the capacitor bottom electrode 41 is being doped, and thus the capacitor bottom electrode 41 may be coarsely doped. The metal diffusion medium layer 44 is formed as described above to resolve this problem.

Figure 10:
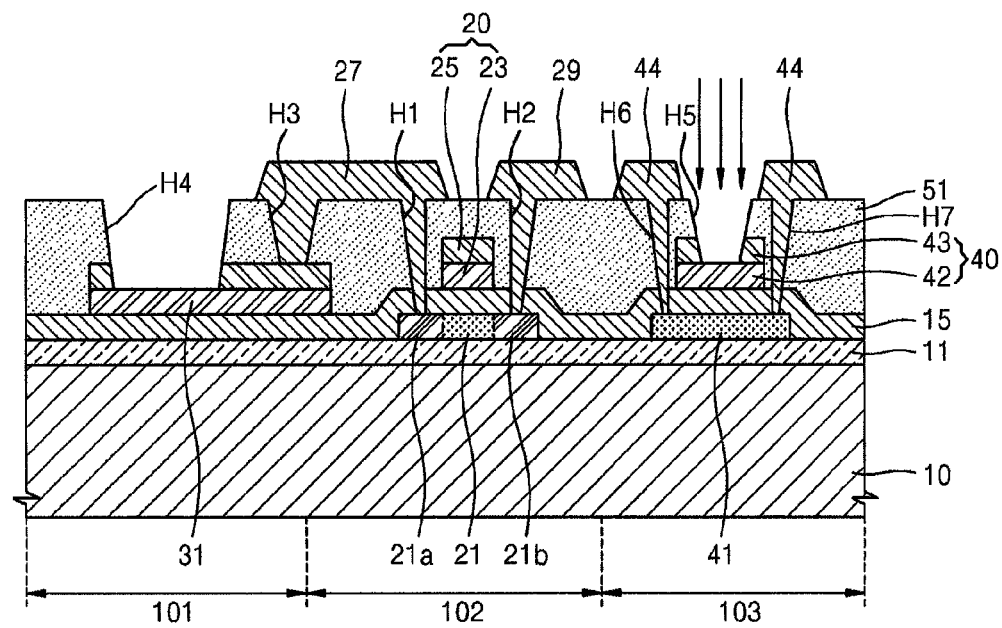

Referring to FIG. 10, the capacitor bottom electrode 41 is doped by implanting an n-type or a p-type impurity via the opening H5. The implanted impurity may be same as or different from the impurity implanted to the active layer 21. Here, a portion of the capacitor bottom electrode 41 covered by the capacitor second top electrode 43 may not be doped properly. In other words, the capacitor bottom electrode 41 may be coarsely doped. However, if a simple heat treatment for heating the metal diffusion medium layer 44 to a temperature from about 300° C. to about 350° C. is performed, metal atoms in the metal diffusion medium layer 44 diffuse into the capacitor bottom electrode 41, and thus metal atoms enter to a scarcely doped region of the capacitor bottom electrode 41. As a result, a resistance of the scarcely doped region, which increases as the region is scarcely doped, is reduced again as metal atoms diffuse thereinto, and thus increase of resistance due to coarse doping may be reduced.

Figure 12A:
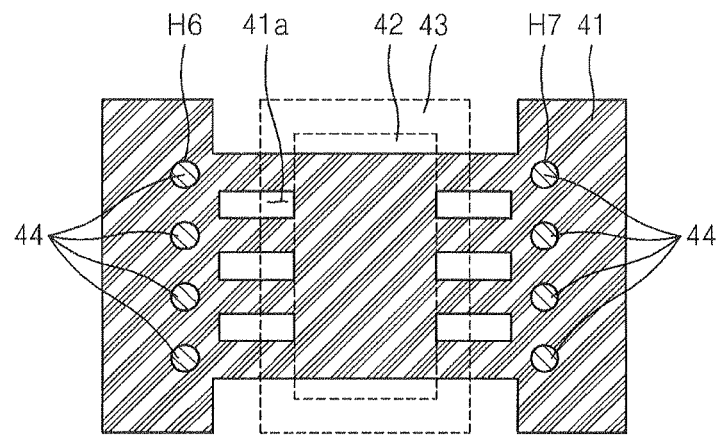
FIGS. 12A and 12B are diagrams showing a capacitor bottom electrode of the organic light emitting display device according to an embodiment modified from the embodiment shown in FIG. 1.
Figure 12B:
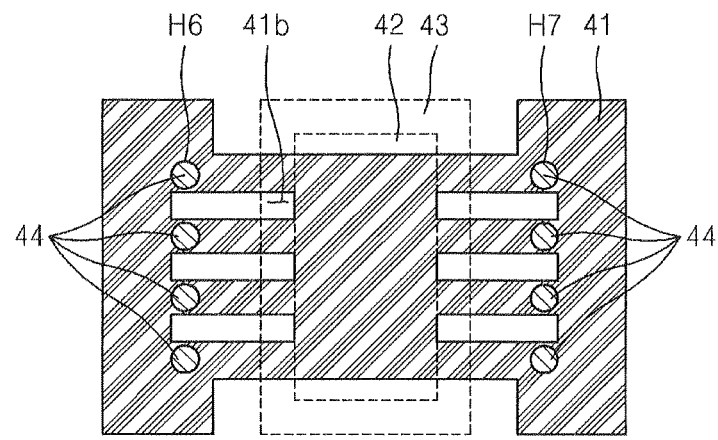

Furthermore, for smoothly diffusing an impurity, it is effective to form slits 41a and 41b in the capacitor bottom electrode 41 as shown in FIG. 12A or FIG. 12B during the formation of the capacitor bottom electrode 41 as shown in FIG. 3 and to form the openings H6 and H7, such that the metal diffusion medium layer 44 is connected to the capacitor bottom electrode 41 between the slits 41a and 41b. In this case, metal atoms diffuse mainly in the lengthwise direction of the capacitor bottom electrode 41a and 41b, and thus the metal atoms may diffuse fast.

Figure 11:
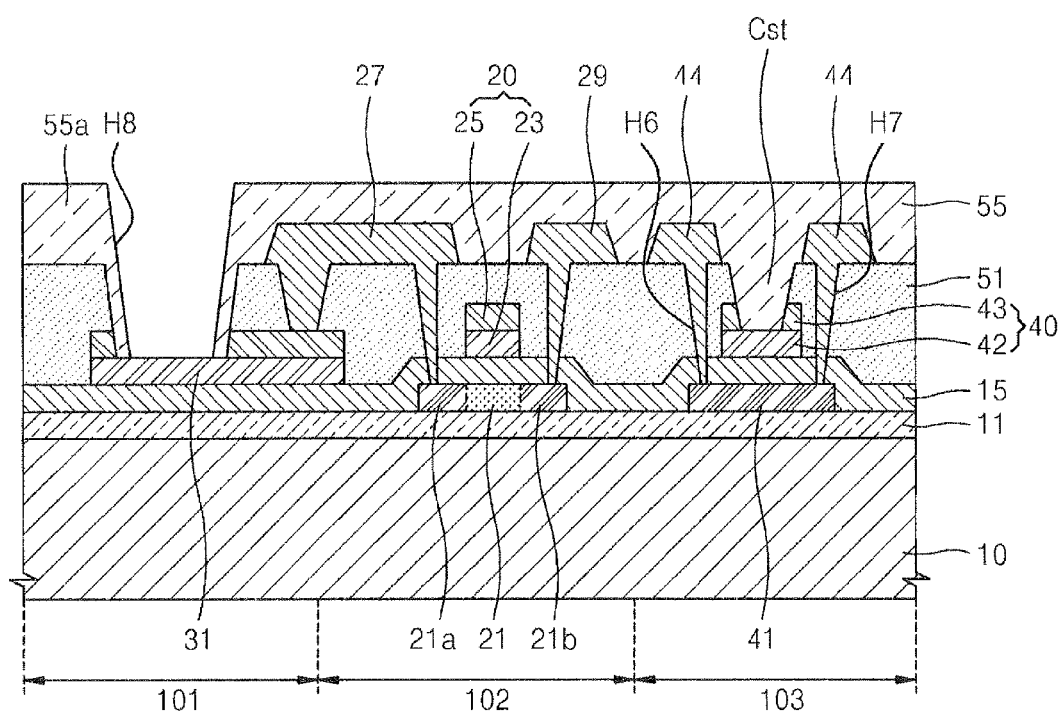

Next, referring to FIG. 11, a pixel defining layer (PDL) 55 is formed on the substrate 10.

A third insulation layer 55a is formed on the whole surface of the substrate 10, on which the pixel electrode 31, the source/drain regions 27 and 29, and the capacitor top electrodes 42 and 43 are formed. The third insulation layer 55a may be formed of one or more organic insulation material selected from a group consisting of polyimide, polyamide, acrylic resin, benzocyclobuten, and phenol resin by using a method, such as spin coating. Furthermore, the third insulation layer 55a may be formed of not only the organic insulation materials as stated above, but also inorganic materials selected from among $SiO_2$, $SiN_x$, $Al_2O_3$, $CuO_x$, $Tb_4O_7$, $Y_2O_3$, $Nb_2O_5$, $Pr_2O_3$, or the like. Furthermore, the third insulation layer 55a may have a multi-layer structure, in which an organic insulation material and an inorganic insulation material are alternately stacked.

The PDL 55 for defining a pixel is formed by forming an opening H8, which exposes the center portion of the pixel electrode 31, by patterning the third insulation layer 55a in a masking operation using a fifth mask (not shown).

Next, as shown in FIG. 1, the intermediate layer 33, which includes an organic light emitting layer, and the counter electrode 35 are formed in the opening H8 exposing the pixel electrode 31.

The intermediate layer 33 may be formed by stacking one or more layers from among an emissive layer (EML), a hole transport layer (HTL), a hole injection layer (HIL), an electron transport layer (ETL), and an electron injection layer (EIL).

The intermediate layer 33 may be formed of an organic monomer material or an organic polymer material. In the case where the organic light-emitting layer of the intermediate layer 33 is formed of an organic monomer material, a HTL and a HIL are stacked on the organic light-emitting layer of the organic light-emitting layer toward the pixel electrode 31, and an ETL and an EIL are stacked on the organic light-emitting layer toward the counter electrode 35. Furthermore, various other layers may be stacked if necessary. Here, the intermediate layer 33 may be formed of any of various materials including copper phthalocyanine (CuPc), N,N'-Di(naphthalene-1-yl)-N,N'-diphenyl-benzidine (NPB), and tris-8-hydroxyquinoline aluminum (Alq3).

Meanwhile, in case where the organic light-emitting layer of the intermediate layer 33 is formed of an organic polymer material, only a HTL may be stacked on the organic light-emitting layer toward the pixel electrode 31. The polymer hole transport layer may be formed of poly-(2,4)-ethylenedihydroxy thiophene (PEDOT) or polyan line (PANI) and may be formed on the top surface of pixel electrode 31 by using a method, such as inkjet printing or spin coating. A polymer organic light-emitting layer may be formed of PPV, soluble PPV's, Cyano-PPV, or polyfluorene, and a color pattern thereof may be formed by using a general method, such as inkjet printing, spin coating, or thermal transfer using a laser.

The counter electrode 35 may be deposited onto the entire surface of the substrate 10 and formed as a common electrode. In case of an organic light emitting display device according to the present embodiment, the pixel electrode 31 is used as an anode electrode, whereas the counter electrode 35 is used as a cathode electrode. However, the polarities of the electrodes may be reversed.

In case of a bottom emission type organic light emitting display device, in which an image is emitted toward the substrate 10, the pixel electrode 31 becomes a transparent electrode, whereas the counter electrode 35 becomes a reflective electrode. Here, the reflective electrode may be formed by depositing a metal with a small work function, e.g., Ag, Mg, Al, Pt, Pd, Au, Ni, Nd, Ir, Cr, Li, Ca, LiF/Ca, LiF/Al, or a compound thereof, as a thin film.

Furthermore, although not shown, a sealing member (not shown) and a moisture absorbing agent (not shown) may be further arranged on the counter electrode 35 to protect the organic light emitting layer from outside moisture or oxygen.

In each of the masking operations for forming an organic light emitting display device as described above, stacked layers may be removed by dry-etching or wet-etching.

According to an organic light emitting display device and a method of manufacturing the same according to an embodiment of the present invention, only five masks are necessary for operations from preparation of a substrate to formation of a PDL, and thus cost reduction and simplification of manufacturing process may be achieved due to a reduced number of masks. Furthermore, a possibility of increase of resistance due to a coarsely doped capacitor may be reduced.

Figure 13:
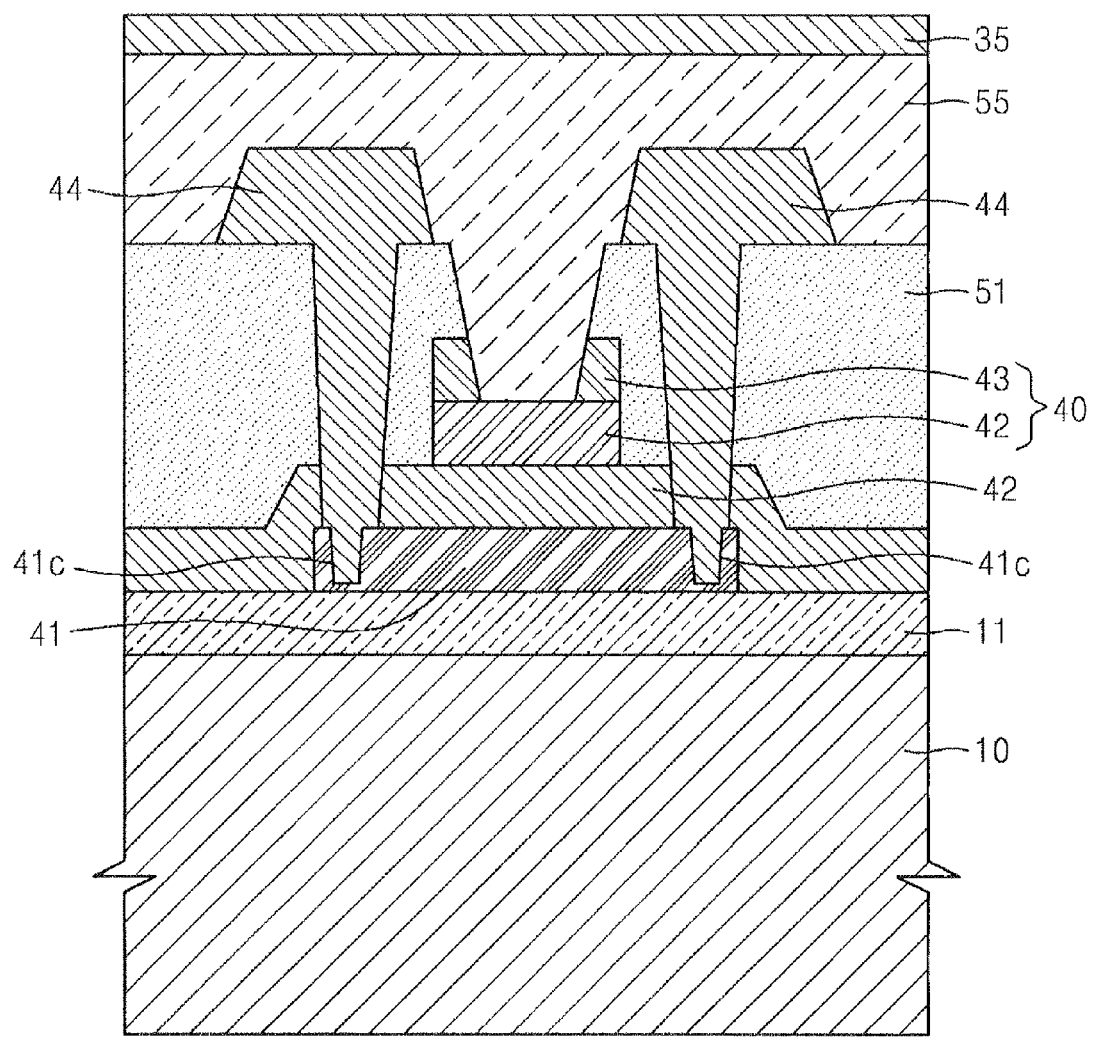
FIGS. 13 and 14 are diagrams showing a capacitor of the organic light emitting display device according to an embodiment modified from the embodiment shown in FIG. 1.
Figure 14:
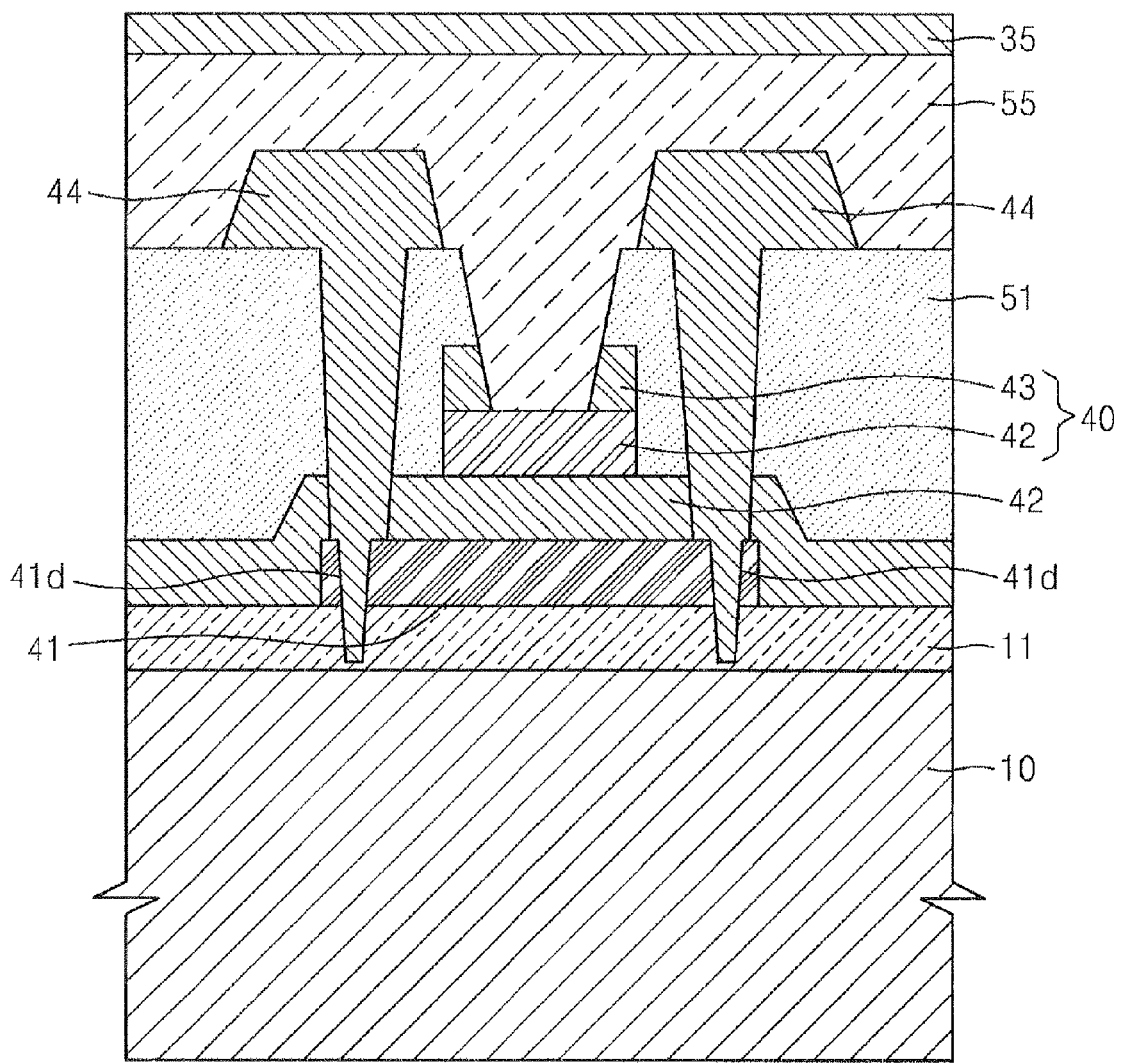

FIGS. 13 and 14 are diagrams showing a structure of the organic light emitting display device according to an embodiment modified from the embodiment shown in FIG. 1. Like reference numerals denote like elements.

First, as shown in FIG. 13, a groove 41c is formed in the capacitor bottom electrode 41, so that the metal diffusion medium layer 44 enters into the groove 41c and contacts the capacitor bottom electrode 41. The groove 41c may be formed during the formation of the capacitor bottom electrode 41 as shown in FIG. 3. When the groove 41c is formed and the metal diffusion medium layer 44 contacts the capacitor bottom electrode 41 via the groove 41c, the metal diffusion medium layer 44 and the capacitor bottom electrode 41 contact each other at larger area. In other words, the metal diffusion medium layer 44 contacts only the top surface of the capacitor bottom electrode 41 in FIG. 1, whereas the metal diffusion medium layer 44 contacts not only the top surface of the capacitor bottom electrode 41, but also a side surface of the capacitor bottom electrode 41 via the groove 41c in the present embodiment. Therefore, the metal diffusion medium layer 44 and the capacitor bottom electrode 41 contact each other at larger area, and thus metal atoms may diffuse more efficiently.

Furthermore, as shown in FIG. 14, a groove 41d may be formed to the buffer layer 11 below the capacitor bottom electrode 41. The groove 41d mal also be formed while the capacitor bottom electrode 41 is being patterned as shown in FIG. 3, and, as a result, the metal diffusion medium layer 44 and the capacitor bottom electrode 41 may contact each other at larger area. Furthermore, since the groove 41d is formed to the buffer layer 11, the metal diffusion medium layer 44 may contact a side surface of the capacitor bottom electrode 41 at larger area.

Therefore, diffusion of metal atoms may be accelerated according to the modified embodiment.

Although drawings referred in the above descriptions of embodiments of the present invention shows one TFT and one capacitor only for convenience of explanation, the present invention is not limited thereto, and a plurality of TFTs and a plurality of capacitors may be arranged.

According to an organic light emitting device and a method of manufacturing the same, cost reduction and simplification of manufacturing process may be achieved due to a reduced number of masks. Furthermore, a possibility of increase of resistance due to a coarsely doped capacitor may be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting display device comprising:
   a thin-film transistor (TFT), which comprises an active layer, a gate electrode, a source electrode and a drain electrode;
   an organic electroluminescent device, which is electrically connected to the TFT, the organic electroluminescent device comprising:
      a pixel electrode, which is formed on the same layer as the gate electrode;
      an intermediate layer disposed on the pixel electrode and including an organic light emitting layer; and
      a counter electrode disposed on the intermediate layer; and
   a capacitor, which comprises:
      a bottom electrode, which is formed on the same layer and of the same material as the active layer, and is doped with an impurity;
      a top electrode, which is formed on the same layer as the gate electrode; and
      a metal diffusion medium layer, which is formed on the same layer as the source and drain electrodes and is connected to the bottom electrode, wherein a plurality of slits is formed in the bottom electrode, and the metal diffusion medium layer is connected to the bottom electrode between the plurality of slits.

2. The organic light emitting display device of claim 1, wherein the gate electrode comprises:
   a first electrode, which is formed on the same layer and of the same material as the pixel electrode; and
   a second electrode, which is formed on the first electrode.

3. The organic light emitting display device of claim 2, wherein the top electrode comprises:
   a first top electrode, which is formed on the same layer and of the same material as the first electrode; and
   a second top electrode, which is formed on the same layer and of the same material as the second electrode, and is partially removed to expose the first top electrode.

4. The organic light emitting display device of claim 1, wherein the pixel electrode is electrically connected to one of the source and drain electrodes.

5. An organic light emitting display device comprising:
   a thin-film transistor (TFT), which comprises an active layer, a gate electrode, a source electrode and a drain electrode;
   an organic electroluminescent device, which is electrically connected to the TFT, the organic electroluminescent device comprising:
      a pixel electrode, which is formed on the same layer as the gate electrode;
      an intermediate layer disposed on the pixel electrode and including an organic light emitting layer; and
      a counter electrode disposed on the intermediate layer; and
   a capacitor, which comprises:
      a bottom electrode, which is formed on the same layer and of the same material as the active layer, and is doped with an impurity;
      a top electrode, which is formed on the same layer as the gate electrode; and
      a metal diffusion medium layer, which is formed on the same layer as the source and drain electrodes and is connected to the bottom electrode, wherein a groove is formed in the bottom electrode, and the metal diffusion medium layer is connected to the bottom electrode via the groove.

6. The organic light emitting display device of claim 5, wherein the gate electrode comprises:
   a first electrode, which is formed on the same layer and of the same material as the pixel electrode; and
   a second electrode, which is formed on the first electrode.

7. The organic light emitting display device of claim 6, wherein the top electrode comprises:
   a first top electrode, which is formed on the same layer and of the same material as the first electrode; and
   a second top electrode, which is formed on the same layer and of the same material as the second electrode, and is partially removed to expose the first top electrode.

8. The organic light emitting display device of claim 5, wherein the pixel electrode is electrically connected to one of the source and drain electrodes.

9. The organic light emitting display device of claim 5, wherein a buffer layer is formed below the bottom electrode, and the groove extends to the buffer layer.

10. A method of manufacturing an organic light emitting display device, the method comprising:
   forming an active layer of a thin-film transistor (TFT) and a bottom electrode of a capacitor on a substrate in a first masking operation;
   forming electrode patterns for forming a gate electrode on the active layer, a pixel electrode on the substrate, and a top electrode of the capacitor on the bottom electrode in a second masking operation;
   forming an interlayer insulation layer, which comprises openings for exposing two opposite ends of the active layer, a portion of the pixel electrode, a portion of the top electrode, and a portion of the bottom electrode in a third masking operation;
   forming source and drain electrodes, which contact the two opposite ends of the active layer and the portion of the pixel electrode exposed by the openings, a metal diffusion medium layer, which contacts the portion of the bottom electrode exposed by the openings, and etching the pixel electrode and the top electrode in a fourth masking operation; and
   forming a pixel defining layer, which exposes the pixel electrode in a fifth masking operation, wherein the organic light emitting display device comprising the thin-film transistor, an organic electroluminescent device, and the capacitor, the thin-film transistor comprising the active layer, the gate electrode, the source electrode and the drain electrode, the organic electroluminescent device being electrically connected to the thin-film transistor, the organic electroluminescent device comprising:
the pixel electrode, which is formed on the same layer as the gate electrode;
an intermediate layer disposed on the pixel electrode and including an organic light emitting layer; and
a counter electrode disposed on the intermediate layer; and the capacitor comprising:
the bottom electrode, which is formed on the same layer and of the same material as the active layer, and is doped with an impurity;
the top electrode, which is formed on the same layer as the gate electrode; and
the metal diffusion medium layer, which is formed on the same layer as the source and drain electrodes and is connected to the bottom electrode, wherein a plurality of slits is formed in the bottom electrode, and the metal diffusion medium layer is connected to the bottom electrode between the plurality of slits.

11. The method of claim 10, wherein the second masking operation comprises:
depositing a first insulation layer, a first conductive layer, and a second conductive layer on the active layer and the bottom electrode; and
forming the gate electrode by patterning the first conductive layer and the second conductive layer to respectively form a first electrode and a second electrode.

12. The method of claim 9 further comprising forming a source region, a drain region, and a channel region between the source region and the drain region by doping the active layer.

13. The method of claim 11, wherein the fourth masking operation comprises:
depositing a third conductive layer on the interlayer insulation layer; and
forming the source and drain electrodes and the metal diffusion medium layer by patterning the third conductive layer.

14. The method of claim 11, wherein the etching in the fourth masking operation comprises partially removing the second conductive layer to form the pixel electrode comprising the first conductive layer, and the top electrode comprising a first top electrode of the first conductive layer and a second top electrode of the partially removed second conductive layer.

15. The method of claim 12, wherein the fourth masking operation further comprises doping the bottom electrode with an impurity via the top electrode and diffusing metal atoms in the metal diffusion medium layer into the bottom electrode.

16. The method of claim 10, wherein the fifth masking operation comprises:
stacking a third insulation layer on the substrate; and
forming the pixel defining layer by patterning the third insulation layer.

17. The method of claim 10, wherein the plurality of slits are formed in the bottom electrode during the first masking operation, and
the openings for exposing the bottom electrode are formed between the plurality of slits during the third masking operation.

* * * * *